United States Patent [19]

Staiger

[11] 4,263,669
[45] Apr. 21, 1981

[54] PATTERN GENERATION SYSTEM
[75] Inventor: Dieter E. Staiger, Weil im Schonbuch, Fed. Rep. of Germany
[73] Assignee: International Business Machines Corporation, Armonk, N.Y.
[21] Appl. No.: 51,073
[22] Filed: Jun. 22, 1979
[30] Foreign Application Priority Data
Jul. 6, 1978 [DE] Fed. Rep. of Germany ....... 2829709
[51] Int. Cl.³ ...................... G01R 31/28; G06F 11/00
[52] U.S. Cl. .................................. 371/27; 324/73 R; 371/21
[58] Field of Search ...................... 371/27, 15, 20, 21; 324/73 R; 364/717, 718, 580

[56] References Cited
U.S. PATENT DOCUMENTS

| | | | |
|---|---|---|---|
| 3,659,087 | 4/1972 | Green et al. | 364/580 |
| 3,713,097 | 1/1973 | Linnerooth et al. | 371/27 |
| 3,719,885 | 3/1973 | Carpenter et al. | 371/27 |
| 3,737,637 | 6/1973 | Frankeny et al. | 371/27 |
| 3,781,829 | 12/1973 | Singh | 371/27 |
| 3,789,195 | 1/1974 | Meier et al. | 235/92 T |
| 3,805,152 | 4/1974 | Ebersman et al. | 324/73 R |
| 3,824,637 | 7/1974 | Johnson et al. | 235/92 PE |
| 3,872,441 | 3/1975 | Cailow | 371/27 |
| 3,930,144 | 12/1975 | Tanaka | 364/718 |
| 4,041,387 | 8/1977 | Dalichow et al. | 324/73 R |
| 4,066,882 | 1/1978 | Esposito | 371/27 |

OTHER PUBLICATIONS

Legnard, Moore, and Tomko, Pattern Generating System, IBM Technical Disclosure Bulletin, vol. 14, No. 2, Jul. 1971, pp. 482-484.

Primary Examiner—Charles E. Atkinson
Attorney, Agent, or Firm—Francis J. Thornton

[57] ABSTRACT

This discloses a pattern generator having a programmable product cycle timer in which a pulse train, i.e., the pattern generated, having a time raster measurable to one nanosecond can be repeated or switched from a first pulse frequency to a second pulse frequency without the usual transient switching periods between pulses. The invention accomplishes this by providing the generator with a cycle timer using a ten nanosecond clock operating in conjunction with a ten nanosecond down counter so that a pre-selected time interval, before the end of the pulse is achieved, a test is made to determine if a required condition needing a different pulse frequency exists. If such a condition does not exist the present pulse frequency is reinitiated so that at count 0 it is repeated without delay. If the required condition does exist loading of the needed pulse frequency is initiated so that upon termination of the presently existing pulse at count 0, the newly selected pulse will be introduced into the product being tested without delay. A programmable cycle timer is provided to permit the implementation of pulses which has a time raster that is other than a ten nanosecond multiple.

6 Claims, 5 Drawing Figures

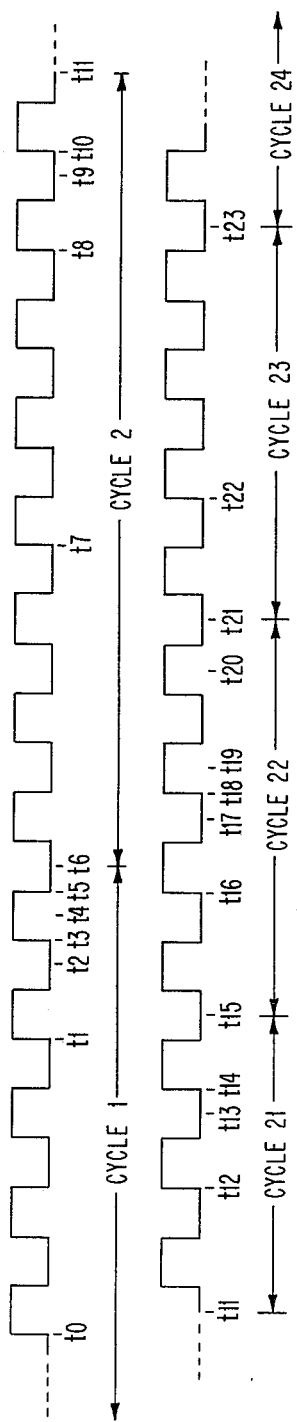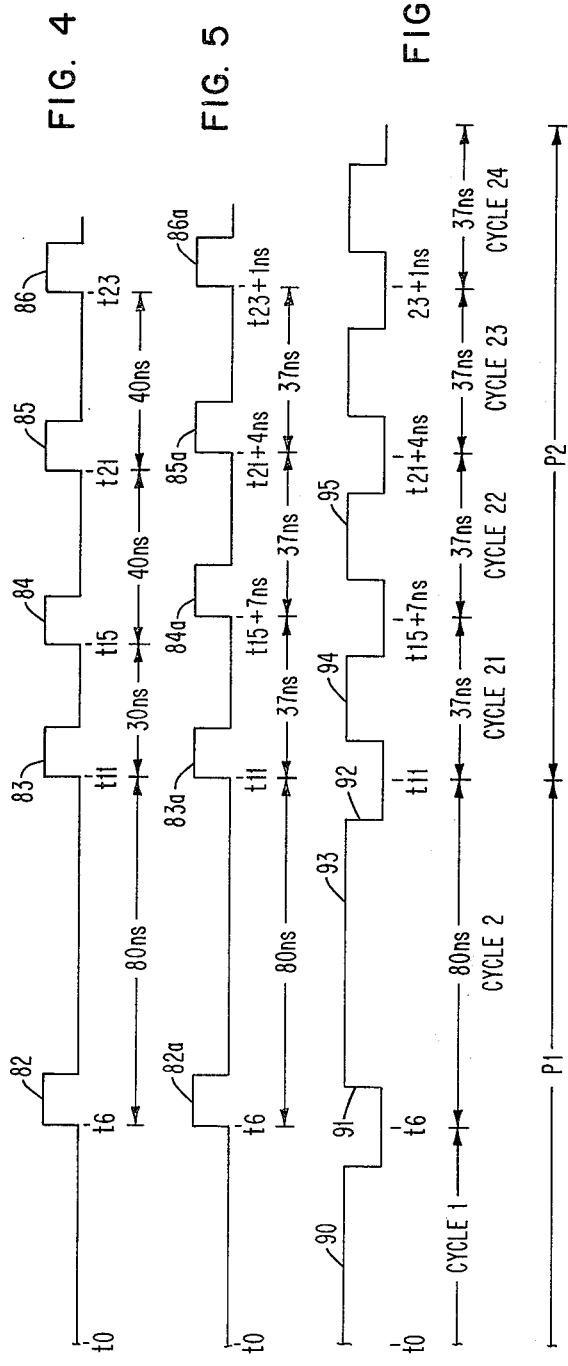

PATTERN GENERATION SYSTEM

DESCRIPTION

1. Technical Field

This invention relates to digital test equipment, particularly to test equipment needed for large scale integrated circuit device testing, and more particularly, to the pattern generator for applying pulse patterns to the product being tested.

2. Background Art

Test pattern generators are well known to the prior art. In the past such generators were specifically designed to produce a series of particular unvarying pulse sequences designed for the particular product being tested. Generally, selected pulse patterns are stored in a memory whose output is fed into a buffer register on demand. From this buffer register the pattern is decoded and introduced into a test system. In such prior art generators new information was not supplied to the buffer register until the old information was exhausted and an end of pattern signal was received by the memory. Thus, whenever it was necessary to switch from one pulse pattern to another a waiting time was necessary before the second pulse pattern could be applied to the product. During these waiting times the product being tested could undergo certain changes such as a discharge of capacitance which could seriously affect the test results being obtained.

RELATED APPLICATION

An application entitled "Pattern Generation System" Ser. No. 930,947 was filed on Aug. 4, 1978 in the name of Dieter Staiger, the present inventor, and assigned to the same assignee as the present invention. This application, Ser. No. 930,947, now U.S. Pat. No. 4,203,543 issued May 20, 1980 discloses a pulse pattern generator system that can provide to a memory product, being tested, a series pattern without time delay between the end of one pattern and the beginning of the following pattern. In this generator pulse cycles are generated with a time raster of 10 nanoseconds.

BRIEF SUMMARY OF THE INVENTION

It is an object of this invention to provide a pulse pattern generator that can provide to a memory product being tested a series of patterns without time delay between the end of one pattern and the beginning of the following pattern with the generated pulse cycles having a time raster of approximately 1 nanosecond.

This invention is directed to a pulse pattern generator that can provide to a memory product being tested a series of pulses with different frequencies without time delay between the end of one pulse and the beginning of the following pulse with the pulses generated having a time raster of other than 10 nanoseconds multiples.

It is another object of the invention to provide a pattern generator with a means that permits, before the end of each pulse, determining if the present pulse is to be repeated or replaced with a new pulse having a different frequency.

BRIEF DESCRIPTION OF THE DRAWING

These and other features of the present invention will be more fully appreciated and understood by considering the following description taken in conjunction with the accompanying drawing in which:

FIG. 2 illustrates a number of count pulses from the down counter with specific times set out that are relate to operation of the circuit in FIG. 1.

FIG. 3 is a representation of successive pulse patterns with different frequencies used in the circuit of FIG. 1.

FIG. 4 is a representation of the cycle start pulses of the programs as they appear on line 24.

FIG. 5 is a representation of the cycle start pulses of the programs as they appear on line 48.

Figure 1:
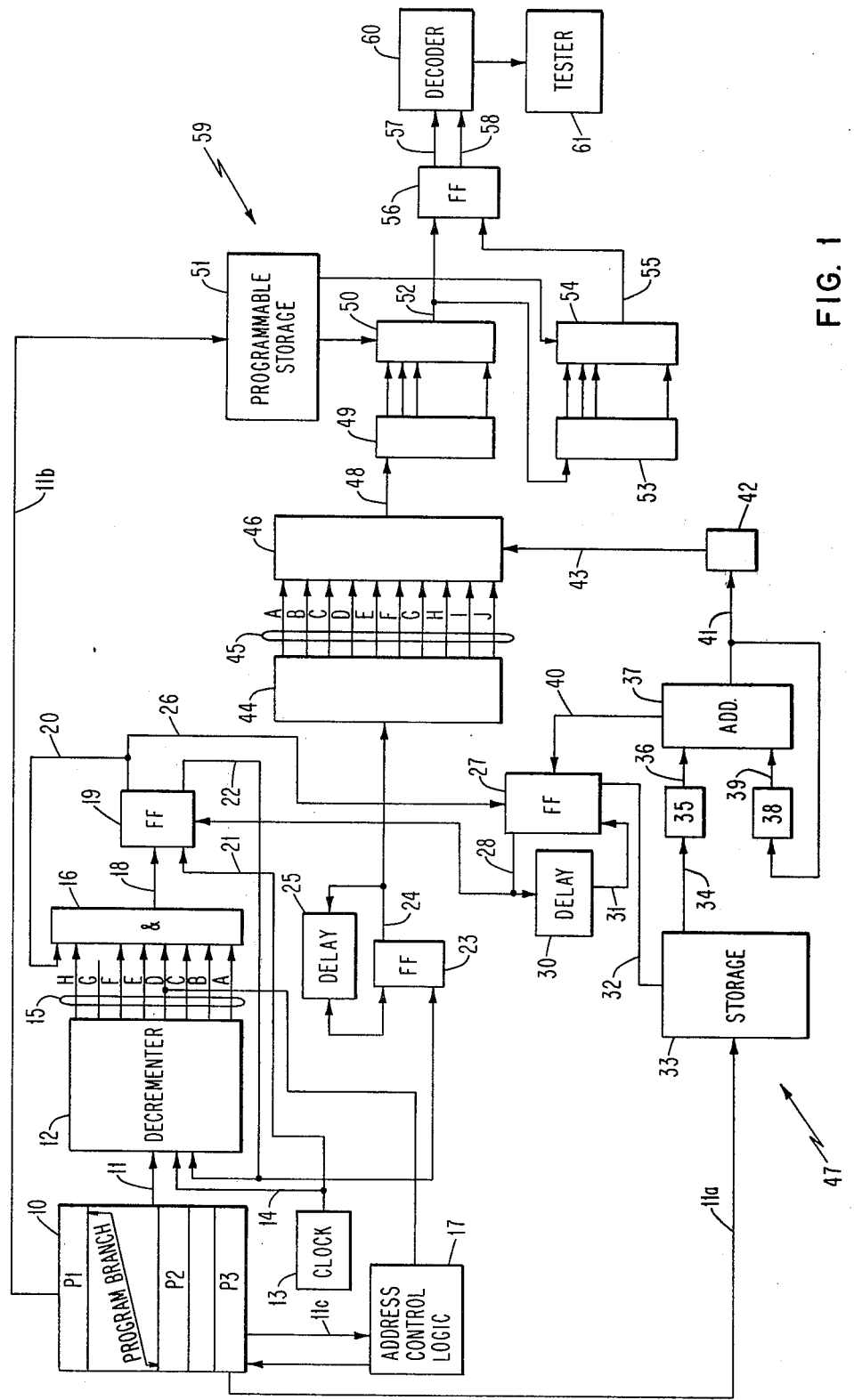
FIG. 1 depicts a schematic circuit for a pulse generator provided with means for generating a series of pulses having a time raster of one nanosecond without a time delay between each pulse.

Referring now to the drawings, there is shown in FIG. 1 a pattern generator comprising three memories 10, 33 and 51, a clock 13, an address control logic circuit 17, a programmable cycle timer 47, a pulse selection circuit 59, and a decoder 60. This generator is coupled to a product tester 61 containing a unit to be tested. The generator is provided with the cycle timer 47 so that pulses can be supplied in one nanosecond increments to the tester without a transient switching period between them. The memory 10 stores therein a plurality of pulse cycle time sequences P1 and P2 more clearly illustrated in FIG. 3. This memory, or storage 10, has outputs 11, 11a and 11b. Output 11 is fed into a ten nanosecond down counter or decrementer 12. Output 11a is fed to storage 33 in the cycle timer 47 and output 11b to storage 51 in the pulse selection circuit 59. The clock 13 feeds a clock signal into the down counter 12 via line 14. The down counter 12 becomes set when a programmed pulse cycle time sequence including a start count signal is received from the storage 10. This programmed sequence sets the value of the cycle time in counter 12, the ten nanosecond increments. For example, the initial program P1 calls for two eighty nanosecond periods cycle 1 and cycle 2 which pulses 90 and 93 shown in FIG. 3, appear. The program P1 contains a code that will set the ten nanosecond down counter 12 to count the eighty nanosecond period of these cycles by counting eight ten nanosecond clock cycles.

The down counter 12 is provided with a plurality of output lines of which lines 15A through 15H are representative. For this example, an output signal on line 15A represents count 80; on line 15B, count 70; on line 15C, count 60; on line 15D, count 50; on line 15E, count 40; on line 15F, count 30; on line 15G, count 20; and on line 15H, count 10. These lines, 15A, 15B, 15C, 15D, 15E, 15F, and 15H are connected to an AND gate circuit 16. Line 15G, representing count 20, is unconnected. Line 15D, representing count 50, is also connected to an address control logic circuit 17 which in turn is coupled back into the storage 10.

For purposes of illustration only, it will be assumed that the first eighty nanosecond period cycle 1 of program P1 is under way and that the AND circuit 16 is on when there is no signal on any of the input lines 15A, 15B, 15C, 15D, 15E, 15F, 15G, 15H and 20. It is also assumed that the address control circuit 17 is responsive to a signal on line 15D. When the counter 12 reaches count 50, that is, fifty nanoseconds before the end of each programmed period, line 15D has an output signal thereon and sends a signal to the output control logic circuit 17. This address control logic circuit 17 checks the storage 10 to determine as to what the next period is to be. In the present example, at time t0, FIG. 2, fifty nanoseconds before the end of the first eighty nanosecond period, cycle 1, (pulse 90), logic circuit 17 would determine that the program P1 calling for another eighty nanosecond period, cycle 2, is to continue. At time t1, FIG. 2, when count 20 is reached, because line 15G is not connected to the AND gate 16, all inputs to the AND gate are negative and the AND gate 16 is activated. When the AND gate 16 is activated, an output trigger signal appears on line 18. However, because of inherent time delays no output appears on line 18 until time t2. This output signal is fed via line 18 to a flip-flop circuit 19. At time t3 the next clock cycle (count 10) is received by flip-flop 19 without delay via line 21 directly from clock 13. The application of these coincidental signals, the clock signal and the AND gate signal, to the flip-flop 19, causes flip-flop 19 to switch its output to lines 20 and 26.

Line 26 leads to a cycle timer 47 which is a nanosecond control circuit designed to modify the period in one nanosecond increments if the selected period is other than a whole number of multiple of ten, i.e., ending in zero. This control circuit 47 comprises a flip-flop 27, a delay 30 connected to the flip-flop 27 and to flip-flop 19, and the storage 33 feeding an input register 35 which, in turn, sends information to an adder 37. This adder 37 feeds an output register 42 and a feedback register 38 as well as flip-flop 27. The signal derived from the output register 42 is sent, via ine 43, to a multiplexer 46.

This nanosecond control circuit is effective only when the pulse length of the program is to be other than a whole number multiple of ten nanoseconds, i.e., this circuit is effective only if the programmed period is a time period that does not end in zero. For the given example the programmed period is eighty nanoseconds and this circuit remains inactive. Because the circuit 47 is inactive the pulse on line 26 is not utilized and flip-flop 19 is permitted to respond, without delay, to the coincidence of the AND output signal on line 18 and the clock signal on line 21.

Line 20 feeds back into the AND gate 16 causing the AND gate 16 to shut off. When the AND gate 16 shuts off flip-flop 19 switches back to its initial state creating an output signal on line 22 at the t4. This output signal on line 22 is fed, at time t5 back to the down counter 12 to prepare the counter for the next loading of the second eighty nanosecond period cycle 2 from the storage 10 so that at time t6, the next period in program P1, i.e., the second period cycle 2 of program P1, initiated by start pulse 82 and containing pulse 93, will be initiated without delay.

The output signal from the flip-flop 19 on line 22 is fed into an additional cycle start flip-flop circuit 23. With the appearance of the output signal on line 22, the flip-flop 23 is activated supplying, at time t6, the cycle start signal 82 on line 24 (shown in FIG. 4) leading to delay unit 44. This is shown in FIG. 3 which portrays the cycle start signals generated on line 24, i.e., the output of flip-flop 23.

FIG. 5 shows that the cycle start signals of FIG. 4 as they appear on line 48 after passing through the delay 44 and multiplexer 46 controlled by the control circuit 47. This delay unit 44 has a plurality of output lines, 45A through 45J, each of which is associated with a specific one nanosecond delay time, leading to a multiplex circuit 46, which receives, via line 43, information and instructions from the control circuit 47 to select a specific pulse from delay 44. Output line 45A of delay 44 transmits the received signal without delay; line 45B transmits the received signal with a one nanosecond delay; line 45C, two nanoseconds delay; line 45D, three nanosecond delay with each line delaying by one additional nanosecond until a nine nanosecond delay is reached on line 45J.

The output of the multiplexer 46 is sent via line 48 to a pulse selection circuit 59. In the instant example, the programmed period is eighty nanoseconds which is a whole number multiple of ten. Thus, control circuit 47 is inactive, there is no signal on line 43 and the multiplexer 46 is in its quiesent state and set to transmit only the information on line 45A, i.e., the undelayed signal received by the delay 44 on line 24. Thus, the cycle start signal 82 appears without delay, as pulse 82a, (shown in FIG. 5) on line 48. The cycle start signal 82 on line 24 is also fed back via delay 25 to an input of the flip-flop 23 to switch the flip-flop 23 back to is initial state and to shut off the signal 82 on line 24 leading to delay 44.

The pulse selection circuit comprises delays 49, and 53, multiplexes 50 and 54, storage 51 and flip-flop 56. The delay unit 49 has a plurality of output lines, each of which is associated to specific delay time, leading to the multiplex circuit 50 which receives via a separate line an instruction from the programmable storage 51 as to which output line of the delay unit 49 is to be selected. Thus, the cycle start signal 82 fed to delay 49 is delayed in delay 49 for a specific time after which it is permitted to pass through the multiplex circuit 50 to output line 52 where it is applied to flip-flop circuit 56 and to the second delay circuit 53. This signal causes flip-flop 56 to become set so that an output signal appears on line 57 leading to the decoder 60. This output signal on line 57 determines the position of the leading edge 91 of pulse 93 within the second eighty nanosecond period of program P1. Delay circuit 53 also has a multiplicity of output circuits feeding the second multiplex circuit 54. This multiplex circuit 54 also receives an input from the programmable storage 51 so that it also selects a specific output line of the delay unit 53 for a specific delay time. When the second multiplex circuit 54 is activated, an output signal from it appears on line 55 which is also fed into the pulse selection flip-flop circuit 56 to return the flip-flop 56 to its initial state and terminate the pulse 93. Thus, this second delay multiplex circuit arrangement determines when pulse 93 terminates during this eighty nanosecond time period. That is, this second arrangement determines when the trailing edge 92 of pulse 93 occurs. Thus, the output circuit from the first multiplex circuit 50 fed into flip-flop 56 causes the flip-flop 56 to be activated to control the leading edge 91 of the pulse 93. The subsequent activation of the delay circuits 53 and the multiplex circuit 54 and the appearance of the pulse on line 55 causes the flip-flop 56 to be switched back to its other state to terminate pulse 93 and control the time of the trailing edge 92 of the pulse 93. In this way, by selectively programming the multiplex circuits 50 and 54 and by selection of the delay times of delays 49 and 53, the pulse 93 is provided with a predetermined width within the programmed eighty nanosecond time period.

This storage 51 is synchronized with the storage 10. One way of achieving this is by providing a suitable signal from the storage 10 to the storage 51 via line 11b. Alternately, the storage 51 need not be a separate unit but could be a portion of the storage 10.

Fifty nanoseconds before the end of this second eighty nanosecond period, cycle 2 (pulse 93) at time t7 (FIG. 2) a program branching to program P2 calling for four 37 nanosecond periods would be indicated. At that time, the program P2 would become loaded into the system so that immediately upon termination of this second eighty nanosecond period (pulse 93), at time t11 the first of the thirty-seven nanosecond periods cycle 21 called for by program P2 would become introduced and the clock cycle and count cycle reset. Because the time of this cycle 21, of program P2 is less than 50 nanoseconds it is necessary that the address control logic 17 receives information from the storage 10, via line 11c, so that it is immediately activated to determine whether or not program branching is to occur. As shown in FIG. 3, the next, i.e., second period cycle 22 (pulse 95) has also a 37 nanosecond length, therefore, the information to determine the next pulse period, cycle 22, (pulse 95) of program P2 is immediately loaded into the down counter 12 and storage 33.

As described above, the down counter 12 counts only in ten nanosecond steps, thus the basic circuit without the functioning of the control circuit 47 will only supply pulses which are a whole number multiple of ten. To achieve this 37 nanosecond pulse it is necessary that the control circuit 47 be active. The description of the activation of this control circuit 47 will be given in conjunction with the pulse diagrams in FIGS. 3, 4 and 5.

The control circuit 47 of FIG. 1 provides an easy, simple means of providing to the pulse selection circuit 59 cycle pulse signals having a spacing that is any whole number of nanoseconds without resorting to such devices as series arranged delay lines.

This control circuit 47 has a storage 33 connected to storage 10 via line 11b and to an input register 35 via line 34. Input register 35 and a feedback register 38 are connected to an adder circuit 37 by respective lines 36 and 39. The adder circuit 37 has a decimal one digit output line 41 leading to an output register 42 and back to the feedback register 38. The output line 43 of output register 42 is connected to the multiplexer 46. The register 35 receives its contents via line 34 from the programmable storage 33 which contains the information necessary to assure that the cycles are thirty seven nanoseconds long. The adder circuit 37 has an additional output line 40 feeding the control flip-flop 27. The flip-flop 27 is coupled to the flip-flop 19 and to a delay circuit 30 via line 28 and to the storage 33 via line 32. Delay circuit 30 has a feedback line 31 to the flip-flop 27.

At time t8 twenty nanoseconds before the end of the cycle 2, the last eighty second pulse period of program P1, (pulse 93) the AND gate 16 is activated by the lack of signal on line 15G. Again because of time delays in AND gate 16 no output appears on line 18 until time t9. This output signal is fed via line 18 to the flip-flop circuit 19. At time t10 the next clock cycle is received by flip-flop 19 without delay via line 21 directly from clock 13. The application of these coincidental signals again causes the flip-flop 19 to switch its output to lines 20 and 26. Line 20 feeds back into the AND gate 16 causing the AND gate 16 to shut off and line 26 is fed to flip-flop 27. When the AND gate 16 shuts off the flip-flop 19 again switches back to its initial state creating an output signal on line 22 which is fed via line 22 to flip-flop 23 which produces at time t11 a start signal 83 on line 24. Because this signal 83, appearing on line 24, is the initial start signal of the new program P2 and because the control circuit 47 is still inactive it passes through the delay 44 and multiplexer 46 without delay and appears immediately on line 48 leading to the pulse selection circuit 59 as signal 83a which is now acted on by the pulse selection circuit 59, as discussed above, to produce pulse 94.

Because the control circuit 47 is still inactive the flip-flop 27 remains ineffective and flip-flop 19 is again permitted to respond without delay to the coincidence of the AND output signal on line 18 and the clock signal on line 21.

At time t12, FIG. 2, count 20 in the first 37 nanoperiod cycle 21 is reached and the AND gate 16 is again activated. Again because of time delays no output appears on line 18 until time t13. This output signal is fed via line 18 to the flip-flop circuit 19. At time t14 the next clock cycle is received by flip-flop 19 without delay via line 21 directly from clock 13. The application of these coincidental signals again causes the flip-flop 19 to switch its output to lines 20 and 26. Line 20 feeds back into the AND gate 16 causing the AND 16 to shut off and line 26 is fed to flip-flop 27. When the AND gate 16 shuts off the flip-flop 19 again switches back to its initial state creating an output signal on line 22. This output signal is fed via line 22 to flip-flop 23 which produces at time t15 an output signal pulse 84 on line 24 thirty nanoseconds after time t11 when pulse 83 appeared on line 24.

Simultaneously the storage 33 is activating register 35 so that it is sending, via adder 37, and register 42, to the multiplexer 46, a signal that sets the multiplexer 46 to pass only signals on line 45H from delay 44. Thus signal 84 is now delayed by seven nanoseconds before it appears as pulse 84a on line 48. Thus pulse 84a appears on line 48 at time t15 +7 ns which is thirty seven nanoseconds after pulse 83a. Thus the first period cycle 21 (pulse 94) of the program P2 is terminated at the end of 37 nanoseconds and the next period cycle 22 (pulse 95) initiated.

Because the adder 37 has received only one signal, i.e., the signal from register 35, of seven nanoseconds duration, the carry line 40 from the adder 37 to flip-flop 27 remains inactive and flip-flop 27 remains in its quiesent state so that the signal on line 26 is again transmitted without delay back to decrementer 12 to permit loading of the next cycle 22.

The output signal of the adder 37 appearing on line 41 is now fed to the feedback register 38 and causes the feedback register to become active and provide adder 37 with a seven nanosecond signal.

The signal 84a is now acted upon by the pulse selection circuit 59 as described above to create pulse 95.

At time t16 count 20 of the second thirty seven nanosecond period, cycle 22, is reached and the signal is once again on line 15G of the decrementer 12. Again at this time all inputs to the AND gate are negative and the AND gate 16 is activated causing an output trigger signal to appear on line 18 at time t17. This output signal is again fed via line 18 to the flip-flop circuit 19 so that it will be coincidental with the next pulse at time t18 and cause the flip-flop 19 to switch and put an output signal on lines 20 and 26.

Again information has been sent to storage 33 in control circuit 47 indicating that once more the signal appearing on line 24 must be delayed by seven nanoseconds. This information is again sent via line 34 to activate register 35 to have it transmit a seven nanosecond informational signal via the adder 37 to register 42. Now however, register 38 is also active and feeding out the seven nanosecond informational signal transmitted to it by the feedback line 41 during cycle 21. These two seven nanosecond input signals from registers 35 and 38 are now added together by the adder 17 to a value of 14 nanoseconds. The adder 37 splits this signal into two portions, i.e., a ten nanosecond portion which is fed via line 40 to flip-flop 27 and a four nanosecond portion which is fed via line 14 to register 38. Thus register 42 received a value of four so that the multiplexer 46 is caused to select line 45e of the delay line 44.

The signal applied to flip-flop 27 via line 40 causes flip-flop 27 to become active and with the delay 30, act as a timing circuit to prevent the flip-flop 19 from being reset at time t17 when the AND gate 16 shuts off. Instead, the signal on line 28 from flip-flop 27 overrides the loss of signal on line 18 and prevents flip-flop 19 from responding to the shutting off of the AND gate 16 at time t19. At time t20 a signal is received on line 32 resetting flip-flop 27 which now shuts off and lets the flip-flop 19 switch its output to line 22 so that at time t21 pulse 85 appears on line 24. This signal on line 22 now loads the decrementer 12 with the next portion of program P2, cycle 23. Signal 85 now on line 24 because of the additional delay signal in the timing sequence, is forty nanoseconds later than signal 84 which previously appeareed on line 24.

Signal 85 is now transmitted to the delay circuit 44 and because of the information put into the multiplexer 46 by circuit 47, line 45e is selected and the signal appearing on line 24 is now delayed four additional nanoseconds so that signal 85a appears on line 48 at time t21 +4 ns which is seventy four nanoseconds after the start of the program P2 and 37 nanoseconds after the pulse 84a appeared on line 48.

The next part of program P2, cycle 23, is now introduced into the system. Once again the sequence described above is repeated with the count 22 of this cycle 23 being reached at time t22. In this instance however, register 38 is storing a four nanosecond informational signal so that when a seven nanosecond pulse is introduced into register 35 the adder 37 totals 11. Once again adder 37 splits this signal into a ten nanosecond signal activating line 40 so that the flip-flop 27 is again activated and a one nanosecond signal fed to multiplexer 46 via register 42. In this instance the output 41 of the adder 37 now, via register 42, sets the multiplexer 46 so that the line 45b representing a one nanosecond delay is selected. The output pulse 86 on line 24 now appears at time t23 forty nanoseconds after pulse 85. This pulse 86 is now delayed one nanosecond by delay 44 and multiplexer 46 and appears at t23 +1 ns as pulse 86a on line 48 one hundred eleven nanoseconds after the beginning of the program P2 and 37 nanoseconds after pulse 85a.

While the invention has been particularly shown and described with the reference to preferred embodiments thereof, it will be understood by those skilled in the art that various changes in form and details may be made therein without departing from the spirit and scope of the invention.

What is claimed is:

1. A pattern generator for supplying to a tester a series of pulse patterns without transient switching times between the patterns comprising:
   a first memory
   said first memory storing programmed sequences of pulse patterns, each of said patterns comprised of a series of cycles and each cycle being of a respective time duration,
   a clock providing spaced clock pulses,
   a clock driven down counter coupled to said clock and down counting in selected time increments,
   pulse selection means for positioning a pulse within said cycle time,
   a cycle start flip-flop for providing a cycle start signal to said pulse selection means,
   an address control logic circuit having inputs from first said memory and from said counter, for determining prior to the end of each cycle time if a different pattern with a different cycle time is programmed,
   output selection means, comprising,
      a first input coupled to said counter and being responsive to a selected output of said counter for providing an output trigger signal,
      a second input coupled to said clock,
      a first output including feedback means for returning said trigger signal to said selection means for terminating said trigger signal when a coincidental clock signal is received with said feedback signal, and
      a second output means for feeding a start signal to said counter for setting said counter to load the next cycle from said memory and to a cycle start flip-flop for providing a cycle start signal to said pulse selection means when said trigger signal is terminated,
   a programmable control circuit including variable delay means positioned between said cycle start flip-flop and said pulse selection means for extending the cycle time by increments smaller than the increments provided by said down counter by selectively delaying the transmission of said cycle start from said cycle start flip-flop to said pulse selection means, and
   a decoder coupled between said pulse selection means and the tester.

2. The pattern generator of claim 1 wherein said programmable control circuit further comprises:
   storage means for setting said variable delay means to delay the transmission of said cycle start signal to said pulse selection means for a selected time increment, and
   a timing circuit coupled to said storage means and to said output selection means for delaying the feeding of said start signal to said counter and said cycle start flip-flop.

3. The pattern generator of claim 2 wherein said delay means includes a nanosecond delay line having a multiplicity of selected outputs coupled to a programmable multiplexer circuit for selecting one of said outputs and feeding said selected one of said outputs to said pulse selection means.

4. The pattern generator of claim 2 wherein said timing circuit comprises:
   a control flip-flop having an input coupled to said first output of said output selection means and an output coupled to said output selection circuit for delaying the feeding of said start signal to said counter and to said cycle start flip-flop.

5. The pattern generator of claim 4 wherein there is further provided a decimal one digit sum adder circuit,
   said adder circuit having an output coupled to said multiplexer, a feedback line and an output to said control flip-flop whereby said adder circuit passes the last digit value of a two digit signal received therein to said multiplexer, and the first value digit of said two digit signal to said control flip-flop to delay said feeding of said start signal to said counter and said cycle start flip-flop by one clock pulse.

6. The pattern generator of claim 5 wherein said control flip-flop is further provided with reset means.

* * * * *